United States Patent
Eisele et al.

(10) Patent No.: US 8,490,681 B2
(45) Date of Patent: Jul. 23, 2013

(54) FLUID COOLING SYSTEM

(75) Inventors: Ronald Eisele, Surendorf (DE); Klaus Kristen Olesen, Soenderborg (DK)

(73) Assignee: Danfoss Silicon Power GmbH, Schleswig (DE)

( * ) Notice: Subject to any disclaimer, the term of this patent is extended or adjusted under 35 U.S.C. 154(b) by 1158 days.

(21) Appl. No.: 10/592,249

(22) PCT Filed: Mar. 9, 2005

(86) PCT No.: PCT/DK2005/000157
§ 371 (c)(1),
(2), (4) Date: Nov. 2, 2006

(87) PCT Pub. No.: WO2005/088222
PCT Pub. Date: Sep. 22, 2005

(65) Prior Publication Data
US 2007/0215332 A1    Sep. 20, 2007

(30) Foreign Application Priority Data

Mar. 11, 2004 (DK) .................................. 2004 00393

(51) Int. Cl.
*F28F 7/02*    (2006.01)
(52) U.S. Cl.
USPC .......................... 165/80.4; 165/169; 361/699
(58) Field of Classification Search
USPC .................. 165/46, 80.4, 80.5, 169; 361/699
See application file for complete search history.

(56) References Cited

U.S. PATENT DOCUMENTS

| | | | | |
|---|---|---|---|---|
| 4,072,188 | A | 2/1978 | Wilson et al. | 165/80 |
| 4,166,665 | A | 9/1979 | Cutchaw | 339/112 |
| 4,933,747 | A | 6/1990 | Schroeder | 357/82 |
| 4,938,279 | A | 7/1990 | Betker | 165/46 |
| 5,079,619 | A * | 1/1992 | Davidson | 257/714 |
| 5,109,317 | A | 4/1992 | Miyamoto et al. | 361/386 |
| 5,205,348 | A * | 4/1993 | Tousignant et al. | 165/46 |
| 5,294,830 | A | 3/1994 | Young et al. | 257/714 |
| 6,264,852 | B1 * | 7/2001 | Herchen et al. | 216/60 |
| 6,420,622 | B1 | 7/2002 | Johnston et al. | 602/41 |
| 2002/0070006 | A1 * | 6/2002 | Mok et al. | 165/80.4 |
| 2004/0074630 | A1 * | 4/2004 | Sen et al. | 165/46 |
| 2004/0256092 | A1 * | 12/2004 | Winslow et al. | 165/168 |

FOREIGN PATENT DOCUMENTS

| | | |
|---|---|---|
| DE | 19964055 | 7/2001 |
| EP | 0 467 711 A1 | 7/1991 |
| EP | 0 516 280 A1 | 4/1992 |
| JP | 2168658 | 6/1990 |
| WO | WO 03/095922 A2 | 11/2003 |

* cited by examiner

*Primary Examiner* — Teresa Walberg
(74) *Attorney, Agent, or Firm* — McCormick, Paulding & Huber LLP

(57) ABSTRACT

The invention provides a fluid cooling system comprising a heat exchanger with an outer wall forming a chamber with an inlet and an outlet for circulating a heat exchange medium in the chamber. The chamber has an opening towards the component which is to be cooled, and to protect the component, the opening is closed by a flexible wall which is attached to the outer wall. To protect the cover and the component against overload, the flexible wall is attached to an inner wall inside the chamber. The cooling system could be applied to electronic systems, e.g. for cooling a DCB substrate or similar electronic components.

7 Claims, 2 Drawing Sheets

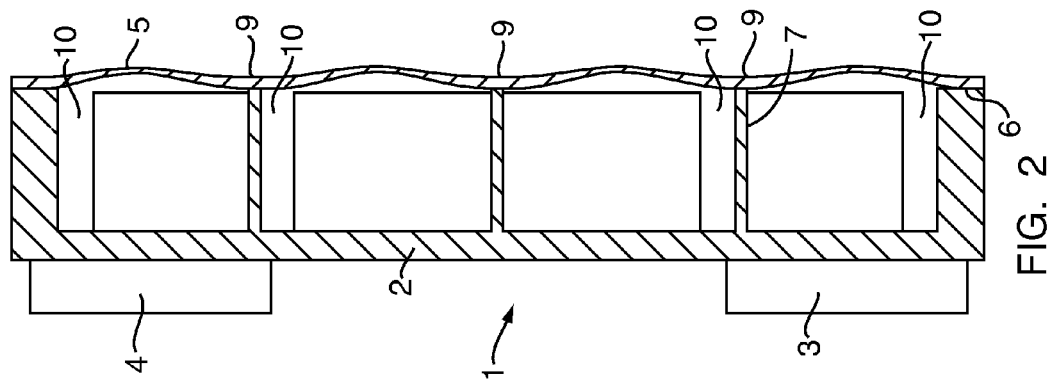
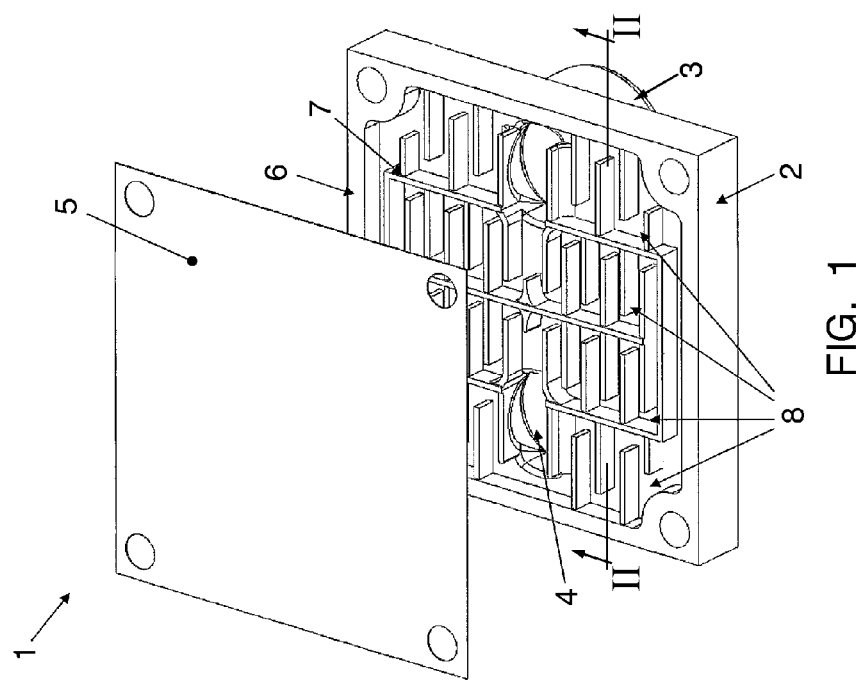

FLUID COOLING SYSTEM

CROSS REFERENCE TO RELATED APPLICATIONS

This application is entitled to the benefit of and incorporates by reference essential subject matter disclosed in International Patent Application No. PCT/DK2005/000157 filed on Mar. 9, 2005 and Danish Patent Application No. PA 2004 00393 filed Mar. 11, 2004.

FIELD OF THE INVENTION

The present invention relates to a fluid cooling system comprising a heat exchanger with an outer wall forming a chamber with an inlet and an outlet for circulating a heat exchange medium in the chamber. The cooling system could be applied for heat exchange between the medium and the surface of a substrate, e.g. an electronic component. The chamber comprises an opening which is covered by a flexible wall which is attached to the outer wall. Due to the flexibility of the wall, good thermal conductivity can be established between the flexible wall and the surface of the substrate.

BACKGROUND OF THE INVENTION

Distributors of the above mentioned kind are known, e.g. from U.S. Pat. No. 5,269,372 wherein a cold plate for cooling electronic modules incorporates a flow network with supply and return conduits for a cooling fluid. In US application no. 2001/0050162, a plurality of plate elements are stacked to form a core with a heat-transfer surface which can be arranged towards a microprocessor device. In the above-mentioned disclosures, the fluid is guided in a device which is separate from the component to be cooled. Even though this independency allows a certain degree of freedom during a manufacturing and assembling process, it results in relatively high manufacturing and assembling costs and since the fluid is separated from the electronic component to be cooled, the cooling efficiency could be reduced.

In WO 03/095922 wherein a bottom side plate of a semiconductor unit is cooled by a liquid which is guided along the plate in direct contact with the plate, the efficiency could be improved by the direct contact. The open structure of the cooling device, however, implies a demand for increased tolerances on the sealing surfaces of the distribution unit and the plate which is to be cooled, and moreover, direct contact between the electronic component and the cooling fluid may influence the reliability of the electronic component.

In U.S. Pat. No. 4,072,188 a fluid cooling system for electronic systems is disclosed wherein a heat exchanger with side walls and a back wall form a chamber, and wherein a flexible wall is fastened or bonded to the side walls to close the chamber. Because of the flexibility, the pressure of the circulating heat exchange medium in the chamber forces the flexible wall into contact with an adjacent substrate to be cooled. If the pressure of the circulating medium exceeds a certain limit, the flexible wall may deflect to an extent where the flexible wall deforms permanently, or the pressure of the flexible wall against the substrate may overload and possibly destroy the substrate. To overcome this problem, one solution would be to reduce the pressure of the circulating medium. This, however, may change the flow conditions and the amount of the fluid which is circulated in the system and thereby reduce the thermal conductivity and heat exchange. Another solution could be to increase the wall thickness or stiffness of the flexible wall. This, however, would influence the thermal conductivity between the medium and the substrate through the flexible wall.

BRIEF SUMMARY OF THE INVENTION

It is an object of the present invention to overcome the problems of the known distribution devices. Accordingly, the invention, in a first aspect provides a fluid cooling system of the kind mentioned in the introduction wherein the flexible wall is further attached to an inner wall inside the chamber.

Due to the attachment of the flexible wall to an inner wall inside the chamber, the deflection of the flexible wall can be limited independently upon the pressure of the medium and the thickness or flexibility of the flexible wall.

As an example, the medium could be a refrigerant of a type well known from refrigeration systems, and in a complete setup, the fluid could be exchanged between the distributor and a compressor to force a phase shift between gas phase and liquid phase of the refrigerant to absorb and emit heat energy, respectively.

The outer wall and the inner wall could be made in one piece, e.g. from a metallic material or from a synthetic material, e.g. a polymeric material. The inner wall may divide the chamber into a plurality of cells extending in parallel between the inlet and the outlet. The flexible wall could be attached to the inner and outer walls so that the cells becomes mutually separated, e.g. so that the medium in one cell can flow in parallel with, and completely separated from the medium flowing in an adjacent cell between the inlet and the outlet. In an alternative embodiment, the flexible wall is attached to the inner wall so that the medium can flow across two adjacent cells.

The flexible wall could e.g. be a foil with properties allowing it to bulge in an outward direction when exerted to a pressure difference, e.g. a difference in the size of 0.05-0.5 bar across the flexible wall. Such a foil could be made from a metallic material, e.g. from aluminium or copper which is rolled to a thickness between 0.02 and 1.0 mm. If one or both of the outer and inner walls correspondingly are made of a metallic material, the foil could advantageously be joined with one or both of the outer and inner walls by soldering.

Alternatively, the foil is made from a polymeric material. In particular, the foil could be made with properties, i.e. a combination between the selected material and foil thickness, so that the pressure of the fluid can press the foil into an outwardly bulging shape.

In order to support a strong adhesion of the foil to a peripheral edge portion of the distributor and to support flexibility of the foil to bulge outwardly, the foil could be made with a non-uniform thickness. In particular, the flexible wall may have a thickness which is higher where the flexible wall is attached to the outer wall and/or to the inner wall. The flexible wall may e.g. have a peripheral edge portion which has an increased thickness. As an example, the thickness of a central portion of the flexible wall could be in the range of 0.02-0.1 mm. whereas the peripheral edge could have a thickness between 0.1 and 1 mm.

In particular, the system could be combined with a multi-layer structure for mounting electronic components, e.g. a system for surface mounting of electronic components such as a DCB structure or such as an IMS structure. Accordingly, the system may comprise a layer of an electrically isolating material with electrically conductive layers joined on opposite sides. A first of the electrically conductive layers may have a surface for attachment of an electronic component. The other electrically conductive layer may form a surface which is contact with the flexible wall to establish thermal convection between the medium and an electronic component attached to the first conductive layer. Due to the possibility of reducing the deflection of the flexible wall and thus to alleviate the pressure on the multilayer structure, the second layer could be a ceramic layer.

The system may comprise pumping means, e.g. a compressor of the kind known from refrigeration systems for supplying the medium at a pressure, e.g. of at least 0.1 bar.

In a second aspect, the invention provides a method of making a heat exchanger with an outer wall forming a chamber with an inlet and an outlet for circulating a heat exchange medium in the chamber, and with an opening which is to be covered by a flexible wall said method comprising the steps of:

Attaching the flexible wall to an inner wall inside the chamber, arranging the heat exchanger in the mould of an injection moulding machine, and injection moulding a component onto the element and onto the flexible wall to adhesively bond the flexible wall to the element by means of the component.

Any feature described in relation to the first aspect may be combined with the second aspect.

BRIEF DESCRIPTION OF THE DRAWINGS

In the following, a preferred embodiment of the invention will be described in further details with reference to the drawing in which:

FIG. 1 shows an exploded, perspective view of the distributor according to the invention, FIG. 2 shows a cross sectional view of the distributor.

DETAILED DESCRIPTION OF THE INVENTION

Figure 3:
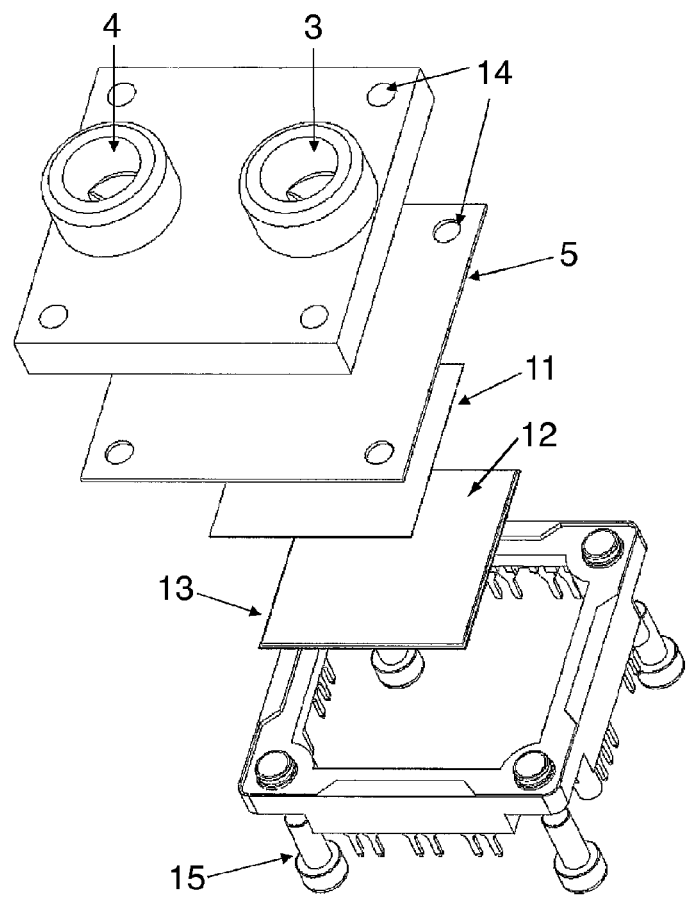
FIG. 3 shows an exploded view of the distributor of FIG. 1 seen from the opposite site, and including an electrical component.

FIG. 1 shows a heat exchanger 1 with an outer wall 2 forming a chamber with an inlet 3 and an outlet 4 for circulating a heat exchange medium in the chamber. The opening is covered by a flexible wall or foil 5 which is attached to a rim portion 6 of the outer wall 2. The flexible wall 5 is further attached to an inner wall 7, i.e. inside the chamber (this is best seen in FIG. 2). The flow cells 8 are connected in parallel between the inlet and outlet.

The medium, e.g. a cooling liquid, which is guided in the cells, is separated from the surface of a substrate which is to be cooled or heated by the flexible wall 5. The flexible foil is made from a sheet of rolled copper or aluminium.

FIG. 2 shows a cross-sectional view of the heat exchanger when assembled with the flexible foil. The flexible wall 5 is attached to the heat exchanger along the peripheral rim portion 6, and to the inner wall 7 at the positions marked with number 9. Accordingly, the attachment of the flexible wall to the inner wall divides the chamber into a plurality of cells 10 extending mutually separated in parallel between the inlet and the outlet.

As shown in FIG. 3, a layer of thermally conductive grease 11, e.g. grease manufactured by Wakefield of Wakefield, Mass., is applied between the flexible wall and the surface 12 of the electrical component 13. The grease fills up the cavities which, in spite of the flexibility of the foil, may appear between the foil and surface. In FIG. 3, the electrical component is shown in two pieces. However, in a typical situation, the component is constituted merely of one single component forming an upper surface for attaching electronic parts and an opposite surface for attaching the distributor. The through-holes 14 are made to enable assembling of the distributor e.g. by use of through-going bolts 15.

In order to force the foil towards the surface, the fluid could be pressurised to a pressure which is sufficient to deflect the foil. Moreover, the foil could be fastened with a slack which allows it to bulge outwardly towards the surface.

Figure 4:
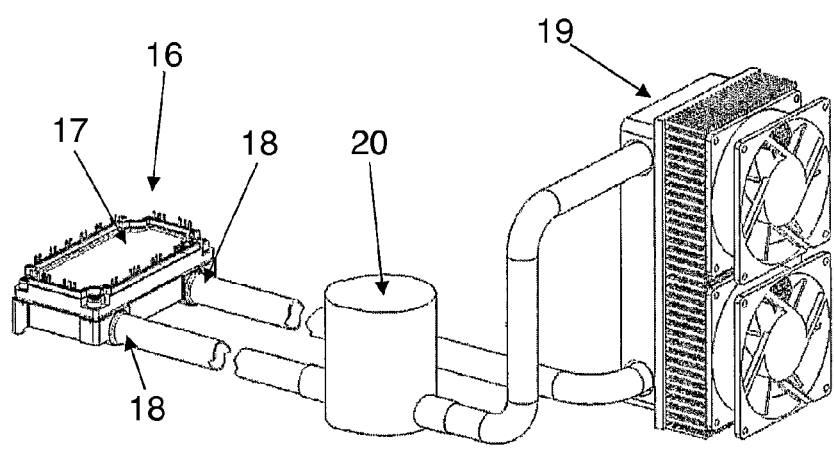
FIG. 4 shows a view of a complete system for cooling electronic components.

FIG. 4 shows a more complete system comprising an electronic component 16 attached to a heat exchanger 17. The system further comprises a set of pipes 18 forming a loop for exchanging a cooling fluid between a refrigeration system 19 and the heat exchanger 17. The system further comprises a combined filter and buffer storage tank 20.

While the present invention has been illustrated and described with respect to a particular embodiment thereof, it should be appreciated by those of ordinary skill in the art that various modifications to this invention may be made without departing from the spirit and scope of the present invention.

What is claimed is:

1. A fluid cooling system comprising:

a heat exchanger with an outer wall forming a chamber with an inlet and an outlet for circulating a heat exchange medium in the chamber, and with an opening covered by a flexible wall which is attached to the outer wall, and to an inner wall inside the chamber;

a ceramic layer located between electrically conductive layers, a first of the electrically conductive layers having a surface for attachment of an electronic component, the other electrically conductive layer forming a surface which is in contact with the flexible wall; and pumping means adapted to pressurize the heat exchange medium to a pressure which is sufficient to deflect the flexible wall, wherein the attachment of the flexible wall to the inner wall divides the chamber into a plurality of cells extending mutually separated in parallel between the inlet and the outlet, each of the plurality of cells defining a meandering flow path substantially equal in length to flow paths defined by the other cells.

2. The system according to claim 1, wherein the flexible wall has properties allowing it to bulge in an outward direction when a pressure difference of 0.1 bar is applied across the flexible wall.

3. The system according to claim 1, wherein the flexible wall has a non-uniform thickness.

4. The system according to claim 3, wherein the flexible wall has a thickness which is higher where the flexible wall is attached to the outer wall.

5. The system according to claim 3, wherein the flexible wall has a thickness which is higher where the flexible wall is attached to the inner wall.

6. The system according to claim 1, further comprising means for supplying the medium at a pressure of at least 0.1 bar.

7. The system according to claim 1, wherein the flexible wall is made from a metallic material which is soldered to the outer wall.

\* \* \* \* \*